(12) United States Patent
Vergauwen

(10) Patent No.: US 11,632,118 B2
(45) Date of Patent: Apr. 18, 2023

(54) CLOSED-LOOP OSCILLATOR BASED SENSOR INTERFACE CIRCUIT

(71) Applicant: Melexis Technologies NV, Tessenderlo (BE)

(72) Inventor: Johan Vergauwen, Tessenderlo (BE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 94 days.

(21) Appl. No.: 17/329,814

(22) Filed: May 25, 2021

(65) Prior Publication Data

US 2021/0376839 A1 Dec. 2, 2021

(30) Foreign Application Priority Data

May 26, 2020 (EP) ..................... 20176683

(51) Int. Cl.
*H03L 7/099* (2006.01)
*G01R 19/252* (2006.01)
(Continued)

(52) U.S. Cl.
CPC ............. *H03L 7/099* (2013.01); *G01D 3/036* (2013.01); *G01D 11/00* (2013.01); *G01D 18/00* (2013.01); *G01D 21/00* (2013.01); *G01R 19/252* (2013.01); *H03M 1/06* (2013.01); *H03M 1/0604* (2013.01); *H03M 1/10* (2013.01); *H03M 1/1014* (2013.01);
(Continued)

(58) Field of Classification Search
CPC ........ H03M 1/60; H03M 1/1014; H03M 1/10; H03M 1/06; H03M 1/0604; G01D 21/00; G01D 3/036; G01D 18/00; G01D 5/16; G01D 3/00; G01D 11/00; H03L 7/099; G01R 19/252

USPC ..... 331/176, 46, 57; 342/124; 324/336, 612, 324/61 R; 307/234

See application file for complete search history.

(56) References Cited

U.S. PATENT DOCUMENTS 8,766,736 B2 * 7/2014 Isik ..................... H03L 1/027
331/1 R
10,473,493 B2 11/2019 Vergauwen
(Continued)

OTHER PUBLICATIONS

Extended European Search Report from corresponding EP Application No. 20176683.9, dated Nov. 6, 2020.
(Continued)

*Primary Examiner* — Arnold M Kinkead
(74) *Attorney, Agent, or Firm* — Workman Nydegger

(57) ABSTRACT

An oscillator-based sensor interface circuit includes first and second input nodes arranged to receive first and second electrical signals representative of an electrical quantity, respectively; an analog filter; a first oscillator arranged to receive a first oscillator input signal and a second oscillator different from the first oscillator and arranged to receive a second oscillator input signal; a comparator arranged to compare signals coming from the first and second oscillators; a first feedback element arranged to receive a representation of the digital comparator output signal and to convert the representation into a first feedback signal to be applied to the oscillation means; a digital filter arranged to yield an output signal, being an filtered version of the digital comparator output signal; a second feedback element arranged to receive the output signal and to convert the output signal into a second feedback signal.

20 Claims, 4 Drawing Sheets

(51) Int. Cl.
 G01D 21/00 (2006.01)
 H03M 1/60 (2006.01)
 G01D 3/036 (2006.01)
 H03M 1/10 (2006.01)
 G01D 11/00 (2006.01)
 H03M 1/06 (2006.01)
 G01D 18/00 (2006.01)
 G01D 3/00 (2006.01)
 G01D 5/16 (2006.01)

(52) U.S. Cl.
 CPC ............... H03M 1/60 (2013.01); *G01D 3/00* (2013.01); *G01D 5/16* (2013.01)

(56) References Cited

U.S. PATENT DOCUMENTS 10,574,244 B2  2/2020  Vergauwen et al.
2020/0373923 A1* 11/2020 Walsh .................. G01D 5/2006

OTHER PUBLICATIONS

Straayer et al., "A 12-Bit, 10-MHz Bandwidth, Continuous-Time ΣΔ ADC With a 5-Bit, 950-MS/s VCO-Based Quantizer," IEEE Journal of Solid-State Circuits, vol. 43, Issue 4, Apr. 4, 2008, pp. 805-814.

Danneels et al., "A Novel PLL-Based Sensor Interface for Resistive Pressure Sensors," Procedia Engineering, Eurosensors 2010, vol. 5, Sep. 5-8, 2010, pp. 62-65.

Marin et al., "A Single-Temperature-Calibration 0.18-μm CMOS Time-Based Resistive Sensor Interface With Low Drift Over a −40° C. to 175° C. Temperature Range," IEEE ESCIRC, Sep. 3-6, 2018, 4 pages.

Marin et al., "A Robust BBPLL-Based 0.18-μ m CMOS Resistive Sensor Interface With High Drift Resilience Over a −40° C.-175° C. Temperature Range," IEEE Journal of Solid-State Circuits, vol. 54, Issue 7, Jul. 7, 2019, pp. 1862-1873.

* cited by examiner

CLOSED-LOOP OSCILLATOR BASED SENSOR INTERFACE CIRCUIT

FIELD OF THE INVENTION

The present invention is generally related to the field of sensor interface circuits for sensor systems.

BACKGROUND OF THE INVENTION

Sensors are increasingly important in any field where finer and ever more intelligent control is needed. Examples are found in the growing fields of automotive applications or wireless sensor networks (WSN). In the automotive industry sensors are essential for applications ranging from increased safety to road stability as well as to improve car performance and reliability demanded by customers. Further, compact and low-power sensor interfaces are needed to be competitive on the growing market and to enable new applications for the 'Internet of Things'.

Although the market asks for additional functionality, the price pressure remains. The silicon area is a main contributor to the cost of the sensor interface, therefore the interface circuit has to be made as small as possible. This should not only be valid for the technology nodes that are used today (and which are still relative big for the automotive industry), but also in more advanced technologies.

To realize small-area and low-power constraints, new sensor interface architectures are being investigated. Whereas traditional structures contain large and power-hungry analog building blocks, recently the focus has shifted to frequency conversion instead of voltage conversion. Both approaches are briefly introduced now.

The sensor signal is continuous in time and amplitude. Conventionally this analog signal is amplified, sampled and converted to the digital domain by an analog to digital converter (ADC). A well-known ADC type is a Delta-Sigma ADC, which exploits an oversampling of the input signal and a noise shaping technique to obtain an improved precision. In most applications, the sensor signal frequency varies from DC up to 10-100 kHz, which allows for the oversampling needed for a Delta-Sigma converter.

Time/frequency-based conversion mechanisms quantize the continuous input signal by using a known time/frequency signal as a reference instead of a voltage. Typically, a time/frequency-based conversion circuit contains two building blocks: a Voltage-to-Time Converter (VTC) transforms the analog signal c(t) into time or frequency information f(t), while a Time-to-Digital Converter (TDC) digitizes this information with the help of a reference frequency. In order to achieve a desired resolution, an accurate reference clock signal is needed. This time/frequency conversion technique is gaining popularity due to its compatibility with newer CMOS technologies. The resolution now depends on the clock frequency instead of the accuracy of analog voltage values. The reduced gate capacitances result in smaller gate delays, improving the timing resolution in these scaled technologies. Furthermore, when the information is stored as frequency information, it is less prone to noise as opposed to when it is stored as voltage information. Sensor signals are in most applications characterized by their low frequency and therefore ideal to use this way of digitization.

Closed-loop oscillator-based sensor interfaces as in FIG. 1 combine the advantages of time based converters (small and scaling with technology) and sigma-delta ADCs (high accuracy due to oversampling and noise shaping). This architecture is basically a Phase-Locked Loop (PLL) structure, but it has also similarities with a sigma-delta converter as explained in the paper "*A novel PLL-based sensor interface for resistive pressure sensors*" (H. Danneels et al., Procedia Engineering, Eurosensors 2010, vol. 5, 2010, pp. 62-65). It has the same noise-shaping properties which contribute in increasing the accuracy (expressed e.g. in terms of SNR).

A typical set-up of a closed-loop oscillator-based sensor read-out circuit contains two controlled oscillators, for example two voltage controlled oscillators (VCOs) which are matched, a binary phase detector to compare the phase difference between the two oscillator outputs and a feedback mechanism towards the sensing means. The digital output signal of the interface circuit is also derived from the phase detector output. Optionally a digital filter is provided after the phase detector to filter the phase detector output before it is fed back and made available as output signal of the interface circuit.

A conventional oscillator based sensor interface circuit used in a closed loop as illustrated in FIG. 1 operates as follows. A physical quantity is converted by the sensor (1) into electrical signals (11, 12) that influence the oscillators (21, 22) connected to it. The phase of the oscillator outputs (41, 42) is compared in the phase detector (3). The phase detector output signal (31) is fed back through a feedback element (4) to the sensor (1) in order to keep the phase difference between both oscillators small and on average close to zero. The closed-loop ensures that the averaged phase detector output (31) is a digital representation of the physical quantity. The input signal containing the physical quantity to be converted in the sensor typically represents a pressure, temperature or magnetic field. Also other types of physical signals can be used as input to the interface.

In the paper "*A Single-Temperature-Calibration 0.18-µm CMOS Time-Based Resistive Sensor Interface with Low Drift over a −40° C. to 175° C. Temperature Range*" (Jorge Marin et al., IEEE ESSCIRC, Sep. 3, 2018, pp. 330.333) a sensor interface is built around only two oscillators, a phase detector, a digital filter and a digital-to-analog converter, which results in a first-order Sigma-Delta design with a predictable transfer function. Time-based chopping and voltage-controlled oscillator (VCO) tuning are combined to remove the DC and low-frequency errors introduced by VCO non-idealities and drift.

The paper "*A 12-Bit, 10-MHz Bandwidth, Continuous-Time Sigma-Delta ADC with a 5-Bit, 950-MS/s VCO-Based Quantizer*"(Straayer et al., IEEE Journal of Solid-State Circuits, vol. 43, no. 4, 1 Apr. 2008, pp. 805-814) presents a circuit with a quantizer structure that allows achieving first-order noise shaping of its quantization noise. The use of feedback to improve the linearity performance of the VCO-based quantizer is addressed as well. The paper is, however, not at all concerned with tackling disturbances induced to the signal path from outside, e.g. electromagnetic interference. The use of an active filter (with amplification at some frequencies) might even make the EMI sensitivity worse.

In U.S. Pat. No. 10,473,493 B2 an oscillator-based sensor interface circuit is disclosed comprising at least two oscillators. A feedback element receives the digital output signal and provides a feedback signal to maintain a given relation between oscillator frequencies of the at least two oscillators. An error like e.g. an oscillator mismatch can be detected and a tuning element is provided to tune at least one characteristic of the sensor interface circuit in order to cause a change in oscillator frequency of at least one of the oscillators to reduce the detected error. Chopping circuitry may be provided for applying modulation and demodulation by means of a chopping signal. In this way offset errors can be reduced or even completely removed.

U.S. Pat. No. 10,574,244 B2 relates to an oscillator-based sensor interface circuit with only one oscillator, wherein a switching element is provided to switch between at least two signals to be applied to the oscillator. A counter counts the number of cycles produced by the oscillator when receiving from the oscillator a signal derived from one of the applied signals. A control output signal is derived from a number of counted oscillator cycles when a first signal is applied to the oscillator and a number of counted oscillator cycles when a signal different from that first signal is applied. The control output signal is then used to derive a feedback signal that aims to maintain a fixed relation between the counted numbers of oscillator cycles.

Although sensor interface circuits as described in U.S. Pat. No. 10,473,493 B2 and in U.S. Pat. No. 10,574,244 B2 have their merits, there is still room for improvement. More in particular in terms of robustness against EMI (electromagnetic interference) the behaviour of the circuits should be improved. Indeed, by for example adding a big capacitor on the sensor nodes or by introducing a low-pass filter between the sensor and the oscillators to filter out disturbance caused by EMI, the feedback loop is delayed and the system as a whole becomes unstable.

Hence, there is a need to solve this issue.

SUMMARY OF THE INVENTION

It is an object of embodiments of the present invention to provide for a closed-loop oscillator based sensor interface circuit that offers noise reduction and robustness against EMI.

The above objective is accomplished by the solutions according to the present invention.

In a first aspect the invention relates to an oscillator-based sensor interface circuit comprising at least a first and a second input node arranged to receive a first and a second electrical signal representative of an electrical quantity, respectively, at least the electrical quantity represented in the first electrical signal being a converted physical quantity, an analog filter arranged to filter at least the first electrical signal, oscillation means comprising at least a first oscillator arranged to receive a first oscillator input signal and a second oscillator different from the first oscillator and arranged to receive a second oscillator input signal, said first oscillator input signal being the filtered first electrical signal from the analog filter and said second oscillator input signal being the second electrical signal or a filtered version thereof, said first and second oscillator input signal impacting the oscillators' frequency, comparator means arranged to compare signals coming from the first and the second oscillator of the oscillation means and to output a digital comparator output signal in accordance with the outcome of said comparing, a first feedback element arranged to receive a representation of the digital comparator output signal and to convert the representation into a first feedback signal to be applied to the oscillation means, either directly or combined with the first and/or second oscillator input signal, respectively, a digital filter arranged to yield an output signal of the oscillator-based sensor interface circuit, said output signal being a filtered version of the digital comparator output signal, a second feedback element arranged to receive the output signal and to convert the output signal into a second feedback signal, said second feedback signal to be combined with the first and/or second electrical signal at the at least first and/or second input nodes, respectively.

The proposed solution indeed allows for an analogue filtering of the electrical signal prior to applying that signal to the oscillation means without jeopardizing the loop stability. This is achieved by splitting the feedback path in two parts. One part comprises the digital signal coming from the comparator means or a representation thereof, which is in a first feedback element converted into a first feedback signal and fed to the oscillation means, directly or after combination with the first and/or second oscillator input signal. The other part comprises a second feedback element which receives the signal output by the digital filter and feeds a signal back to at least one of the input nodes and the subsequent analogue filter. Hence, only the feedback signal obtained via the digital filter and the second feedback element is fed to the analog filter. Adding the first feedback signal only after the analog filter is beneficial for the stability of the sensor interface circuit.

In some embodiments the sensor interface circuit comprises chopping circuitry arranged for modulating the first and second oscillator input signal with a chopping signal and for feeding the modulated signal to the oscillation means and arranged for demodulating the signals coming from the first and second oscillators of the oscillation means.

In preferred embodiments the sensor interface circuit is arranged to combine the first feedback signal with the filtered signal received from the analog filter.

In embodiments the sensor interface circuit comprises at least one further oscillator arranged to generate a master clock signal for performing sampling.

In some embodiments the oscillation means comprises a ring oscillator having a plurality of stages.

In a preferred embodiment one or more oscillators of the oscillation means is/are arranged to receive the first feedback signal. In an embodiment with a ring oscillator the first feedback signal may be connected to the control input of at least one of the ring oscillator stages, while the filtered first electrical signal received from the analog filter is input to the remaining stages. Also in other types of oscillation means (i.e. not with ring oscillators) there may be at least one control input for receiving directly the first feedback signal and at least one for receiving the filtered signal.

In one embodiment the first feedback element is arranged to multiply the digital comparator output signal with a scaling factor.

In embodiments the comparator means comprises storage means for storing the digital comparator output signal.

In some embodiments the comparator means is arranged to add dither before comparing the signals from the oscillation means.

In an embodiment the first feedback element comprises a digital-to-analog converter to convert the representation of the digital comparator output signal into the first feedback signal.

Preferably the digital filter comprises an integrator arranged to yield the integrated version of the digital comparator output signal. The integrator is in some embodiments implemented as a counter. The feedback path comprising the integrator advantageously also contains a finite impulse response filter. The finite impulse response filter may also be present in embodiments wherein there is no integrator in the digital filter.

In one embodiment the first feedback element is implemented as a voltage divider. Preferably the voltage divider is selectable, i.e. the voltage division can be adapted so that a different output signal is obtained.

In one embodiment the comparator means is implemented as a phase detector. In some embodiments the phase detector is realized with a single flip-flop. The comparator may comprise a counter in certain embodiments.

In a further embodiment the oscillator-based sensor interface circuit comprises a sensing means arranged to convert the physical quantity comprised in a received signal into the electrical quantity and to output the first electrical signal representative of the electrical quantity. The received signal may be one of a pressure, a temperature, a force, an optical signal or a magnetic signal.

In some embodiments the sensing means is arranged to receive the second feedback signal.

In another aspect the invention relates to an oscillator-based sensor interface circuit comprising:

at least one input node arranged to receive an electrical signal representative of an electrical quantity, said electrical quantity being a converted physical quantity, an analog filter arranged to filter the electrical signal, oscillation means comprising one oscillator arranged to receive the filtered signal from the analog filter, said filtered signal impacting said one oscillator's frequency, comparator means arranged to compare a signal coming from the oscillation means with a reference value and for outputting a digital comparator output signal in accordance with the outcome of said comparing, a first feedback element arranged to receive a representation of the digital comparator output signal and to convert the representation into a first feedback signal to be applied to the oscillation means, either directly or combined with the filtered signal from the analog filter, a digital filter arranged to yield an output signal of the oscillator-based sensor interface circuit, said output signal being an filtered version of the digital comparator output signal, a second feedback element arranged to receive the output signal and to convert the output signal into a second feedback signal, said second feedback signal to be combined with the electrical signal at the at least one input node.

In embodiments of this aspect of the invention the oscillation means comprises between the analog filter and the oscillation means a switching device arranged to switch between at least two signals to be applied alternately to the oscillator.

In preferred embodiments of this other aspect the oscillator-based sensor interface circuit is arranged to derive that reference value from the signal coming from the oscillation means while a reference signal is applied via the switching device.

In other preferred embodiments the sensor interface circuit is arranged to combine the first feedback signal with the filtered signal received from the analog filter.

In embodiments the sensor interface circuit comprises at least one further oscillator arranged to generate a master clock signal for performing sampling.

In some embodiments the oscillation means comprises a ring oscillator having a plurality of stages.

In a preferred embodiment of the second aspect one or more oscillators of the oscillation means is/are arranged to receive the first feedback signal. In an embodiment with a ring oscillator the first feedback signal may be connected to the control input of at least one of the ring oscillator stages, while the filtered first electrical signal received from the analog filter is input to the remaining stages. Also in other types of oscillation means (i.e. not with ring oscillators) there may be at least one control input for receiving directly the first feedback signal and at least one for receiving the filtered signal.

In one embodiment the first feedback element is arranged to multiply the digital comparator output signal with a scaling factor.

In embodiments the comparator means comprises storage means for storing the digital comparator output signal.

In some embodiments the comparator means is arranged to add dither before comparing the signals from the oscillation means.

In an embodiment the first feedback element comprises a digital-to-analog converter to convert the representation of the digital comparator output signal into the first feedback signal.

Preferably the digital filter comprises an integrator arranged to yield the integrated version of the digital comparator output signal. The integrator is in some embodiments implemented as a counter. The feedback path comprising the integrator advantageously also contains a finite impulse response filter. The finite impulse response filter may also be present in embodiments wherein there is no integrator in the digital filter.

In one embodiment the first feedback element is implemented as a voltage divider. Preferably the voltage divider is selectable, i.e. the voltage division can be adapted so that a different output signal is obtained.

In one embodiment the comparator means is implemented as a phase detector. In some embodiments the phase detector is realized with a single flip-flop. The comparator may comprise a counter in certain embodiments.

In a further embodiment the oscillator-based sensor interface circuit comprises a sensing means arranged to convert the physical quantity comprised in a received signal into the electrical quantity and to output the first electrical signal representative of the electrical quantity. The received signal may be one of a pressure, a temperature, a force, an optical signal or a magnetic signal.

In some embodiments the sensing means is arranged to receive the second feedback signal.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

DETAILED DESCRIPTION OF ILLUSTRATIVE EMBODIMENTS

Figure 1:
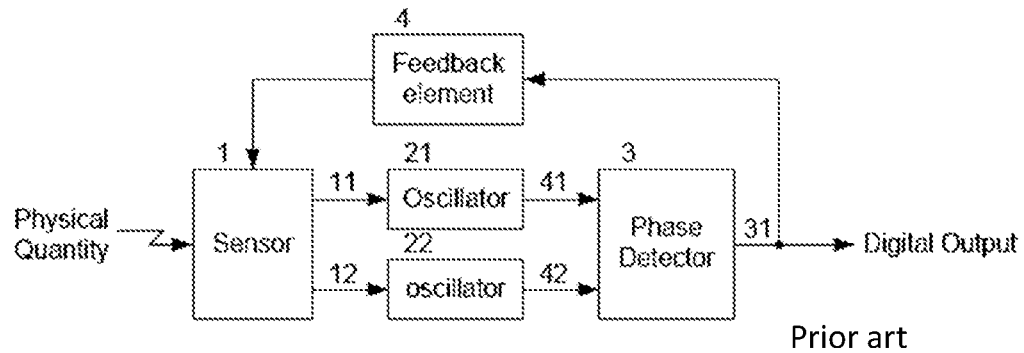
FIG. 1 illustrates a conventional oscillator based sensor interface circuit used in a closed loop.

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

The present invention discloses a closed-loop sensor interface circuit with improved EMI robustness. More in particular, a sensor interface circuit is proposed so designed that a low-pass filter to combat EMI disturbance can be added between sensing and oscillation means without rendering the loop unstable. This filtering also reduces the sensor noise and the noise created by the feedback to the sensor or sensor nodes.

A sensor converts a physical quantity into an analog electrical quantity. Typically the sensor output signal is too small to be used directly. Therefore a sensor interface circuit amplifies the signal comprising the electrical quantity received from the sensor to obtain a more useful signal. The signal is often also further processed in the sensor interface. Additionally the signal can be converted to a digital signal and further processed in the digital domain. In the context of the present invention a sensor interface circuit is considered to be a structure to transfer the electrical quantity coming out of the sensor into a digital signal. Although the input signal containing the physical quantity to be converted in the sensor often represents a pressure, temperature or magnetic field, also other types of physical signals can be used as input to the interface circuit of this invention.

Although it may be advantageous in many embodiments of the sensor interface circuit of the invention to have the sensor as a part of the interface circuit, this is not strictly required. In other embodiments the sensor(s) may be external to the circuit of the invention and the circuit is fed with an electrical signal representative of the electrical quantity into which the physical quantity is converted in the sensor.

A closed-loop sensor interface circuit according to a first aspect of the present invention comprises two or more input nodes that each receive an electrical signal representative of an electrical quantity. At least the electrical quantity of a first electrical signal received by a first node is a converted physical quantity. The interface circuit is provided with oscillation means comprising at least a first oscillator that receives a first oscillator input signal and a second oscillator, different from the first oscillator, that receives a second oscillator input signal. The first oscillator input signal is the first electrical signal filtered by an analogue filter. The second oscillator input signal is the second electrical signal in a filtered version or non-filtered ersion. In case also the second electrical signal is filtered, it is to be noted that it is not strictly needed that the first and the second electrical signal undergo exactly the same filtering. In case the first and the second electrical signal form a differential signal pair, both signals are applied to the same analogue filter.

FIG. 2 illustrates two embodiments of a block scheme of a closed-loop sensor interface circuit according to this first aspect. It comprises two oscillators (110,120) and two feedback loops. Since it is highly digital-oriented, the proposed architecture is highly scalable with technology and thus more area-efficient, energy-efficient and robust against process variations and external factors. This makes the structure a good candidate for sensor readout circuitry in emerging applications such as smart sensors, wireless sensor networks, health care monitoring, etc.

Figure 2A:
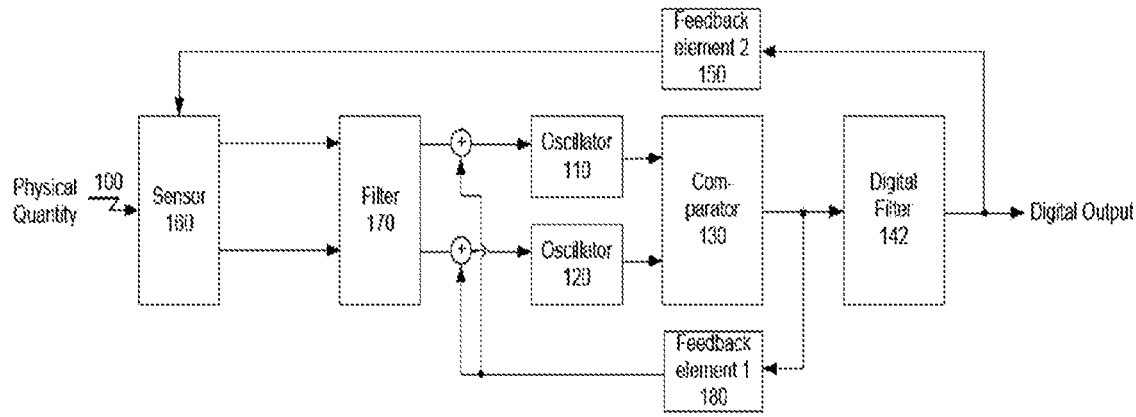
FIG. 2 illustrates two embodiments (FIG. 2a, FIG. 2b) of a sensor interface circuit according to the invention.

In the embodiment shown in FIG. 2*a* the sensor is part of the sensor interface circuit. It is repeated that this feature is optional. The sensing means (160) can be implemented in many different ways. One implementation of the sensor may be with two resistors, which are varied by the signal (e.g. pressure) that needs to be sensed. Alternatively, only one resistor is variable and the other one is fixed. In another embodiment the number of resistors is different (e.g. four resistors in a Wheatstone bridge configuration). The skilled person will readily recognize that other configurations are also possible. Also other types of sensors can be used in various configurations. For example, instead of a resistive sensor, a capacitive sensor can be employed. In certain embodiments the sensor and the oscillator can be merged into a sensor controlled oscillator.

In these embodiments the two or more input nodes each receive an electrical signal representative of an electrical quantity. A physical quantity (measured by a sensor) is converted into the electrical quantity. However, not all electrical signals applied to the input nodes need to represent the electrical quantity represented in a first electrical signal. A second electrical signal can, for example, be a fixed reference signal not related to a physical quantity measured by a sensor. In any case, at least one of the electrical quantities is a converted version of the physical quantity sensed by the sensing means (which is part of the interface circuit or not, as explained). In the particular embodiments shown in FIG. 2 both the first and the second electrical signal are representative of the converted physical quantity observed by the sensor. As set out, this is just one possible option in embodiments of the sensor interface circuit.

In embodiments according to this first aspect the oscillation means comprises at least a first and a second oscillator, as already mentioned. Various kinds of controlled oscillators can be envisaged for use in the sensor interface circuit. An obvious choice is a voltage controlled oscillator or a current controlled oscillator, but other options are valid too, e.g. a capacitance controlled oscillator. In the embodiments shown in FIG. 2*a* and FIG. 2*b* there are two controlled oscillators (110,120). There may also be more than two oscillators. A third oscillator can for example be used to generate the master clock for the digital core of the chip comprising the sensor interface circuit. The two other oscillators could then be changed so that on average they are running at the same frequency as the third oscillator or at a certain fraction or multiple of it. Another option is performing a measurement of the average oscillation frequency of the controlled oscillators relative versus the master clock. This measurement (or the feedback signal needed to have the two controlled oscillators running at a fixed rate versus the master clock) yields information about the common mode output of the sensor. This common mode signal is for piezo-resistive pressure sensors a measure of the temperature of the piezo-resistors. Alternatively the digital master clock can be directly derived from one oscillator of the oscillation means used by the sensor interface. In that case it can be advantageous to keep this oscillator at a fixed frequency and to control only the other oscillator. A fixed oscillator frequency can also be generated by using a (fixed) reference signal as input of a controlled oscillator.

In embodiments where the oscillation means comprises at least two oscillators, the comparator (130) compares the output signals received from the first (110) and the second (120) oscillator of the oscillation means and accordingly outputs a digital comparator output signal. The comparator output can be a single bit. In this simplest form the comparator may be just a flip-flop, e.g. a D-flip-flop wherein one signal is used as clock and the other signal as data input. The output signal shows in this case only which of the two inputs toggled first. The comparator can be implemented as a phase detector in some embodiments. Also multi-bit comparators can be used. In that case the output may contain further information about the time difference between the toggling of both inputs.

In some embodiments the comparator contains a memory. A new comparator output value may then be based on the comparator inputs and on one or more of the previous comparator output values kept in that memory. For example, a comparator with hysteresis may be used, whereby the comparator output in between two thresholds is dependent on the previous comparator decision.

In certain embodiments the comparator compares the inputs of the comparators after dither, i.e. intentionally applied noise, has been added. Dither is applied to randomize the quantization error. It is often used in (first order) sigma-delta converters to avoid dead bands and limit cycles.

In embodiments the memory function and the dither as described above can be combined, e.g. dither may be only added when a certain pattern is recognized in the comparator output.

Figure 2B:
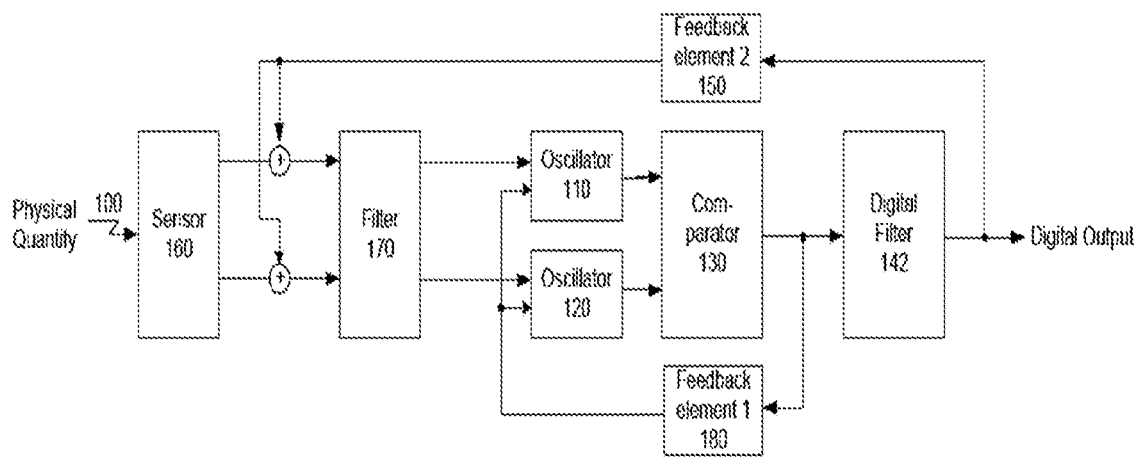

The comparator output signal is applied to a feedback element (180), named feedback element 1 in FIG. 2 and provided in a path towards the oscillation means. The feedback signal output by the feedback element 1 (180) is in the embodiment shown in FIG. 2*a* applied to the input to the oscillation means, where it is combined with the signals output by the filter (170), so forming the first and second oscillator input signals, respectively. The combination means to combine the feedback signal and the filter output signal may for example be a simple adder. For example, in an embodiment with a current starved ring oscillator the control current can be obtained by summing a current depending on the filtered sensor signal (i.e. the filtered first electrical signal) and a current depending on the feedback signal from feedback element 1 (180). In another embodiment (as in FIG. 2*b*) the feedback signal output by the feedback element 1 (180) may directly be fed to the oscillation means. Again taking the example of a ring oscillator, the feedback signal can be directly connected to the control input of one or more of the ring oscillator stages. The other stages can then be fed with the filtered sensor signal (i.e. the filtered first electrical signal). Note that in oscillator implementations different from a ring oscillator there may also be two control inputs, so that one can be used for the feedback signal and one for the signal coming from the analogue filter. In feedback element 1 (180) provided in this feedback path, the comparator output signal is converted into a feedback signal by multiplying the comparator output signal with a proportionality factor. In many embodiments the proportionality factor is equal to 1. However, the feedback element (180) is not necessarily a pure multiplier. It may also take care, for example, of the digital-to-analogue conversion of the comparator output signal. This feedback path is referred to as proportional path since it simply acts on the comparator output signal or a scaled version of the comparator output signal. The signal in this proportional path contains no real sensor information because the average signal value is fixed to the middle value, assuming that both the first and the second oscillator (110, 120) are locked. The main purpose of the proportional path is to make the interface circuit stable.

The comparator output signal is also applied to a digital filter (142). The outcome of the digital filtering, hence a filtered version of the comparator output signal, constitutes the digital output signal of the oscillator-based sensor interface circuit. The digital filter is in preferred embodiments implemented as an integrator, for example as a counter. The filtered version of the comparator output signal is applied through a feedback element (150), in the embodiment shown in FIG. 2a depicted as feedback element 2, to the sensor (160). Just as feedback element 1 (180), feedback element 2 (150) may also take care of the digital-to-analogue conversion of the comparator output signal. In case the sensor is not a part of the interface circuit, the feedback signal output by feedback element 2 (150) is combined with, e.g. added to, the first and/or second electrical signal at an input node or at two input nodes of the interface circuit (see FIG. 2b). The combination means per se are known to the skilled person, e.g. means for summing signals. In any case the resulting signal is applied to an analog low-pass filter (170), which is added to filter out the disturbance due to EMI. Note that in case the second electrical signal is not derived from a physical quantity observed by the sensor, but is e.g. rather a reference signal, the filtering applied to that second electrical signal is not necessarily the same as for the first electrical signal. It may even be that the second electrical signal is applied to the second oscillator (120) without any filtering at all.

In another embodiment the first oscillator receives as first oscillator input signal the electrical signal obtained from the sensor signal and filtered by the analog filter and the second oscillator receives at its input a signal derived from the first feedback signal. The second oscillator input signal is then for example a signal that toggles between two reference signals controlled by the first feedback signal. In this embodiment there is no need anymore to combine the first feedback signal with the filtered first electrical signal. In this particular embodiment the second feedback signal can also just go to the input node that receives the first electrical signal obtained from the sensor signal and not to other input nodes.

The inventor has made the consideration that when adding the analog low-pass filter, while still keeping the full feedback (proportional and integral) to the sensor or to the input node receiving the sensed signal, the loop becomes unstable. Adding the low-pass filter and performing the full feedback after the filter takes the sensor signal out of the loop and is a fundamentally different (worse) solution. However, if a low-pass filter is added after the sensor to act on the sensed signal (i.e. to act on at least the first electrical signal), the system can be made stable by having the feedback of the proportional path only after the analog filter.

The digital output of the sensor interface circuit can in principle be based on the sum of both proportional and integral path, but there is no real information transmitted in the proportional path. Therefore it is preferable (more stable) to use only the integral path for the data output. This confirms that there is no real need to have the proportional path fed back to the input node (or to the sensor) since is does not bring any advantage.

FIG. 2b illustrates an embodiment with the same functional blocks as in FIG. 2a, but shows one of the other options to apply the two feedback signals. Indeed, the feedback signal output by feedback element 1 (180) is directly fed to the oscillator means (i.e. the first (110) and second (120) oscillator) and the feedback signal from feedback element 2 (150) is, in this particular example, at a first and a second input node of the sensor interface circuit combined with the sensor output signal to form the input signal to the analog low-pass filter.

Figure 3:
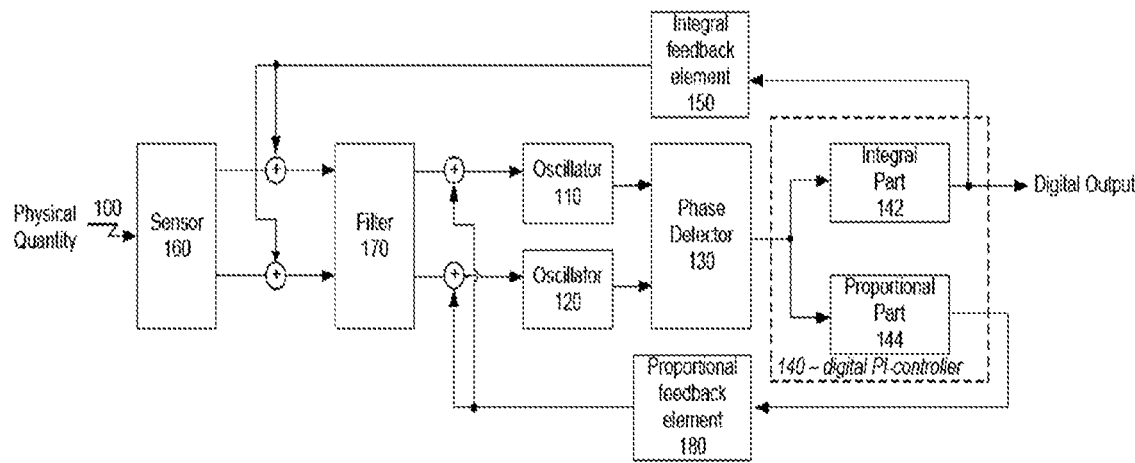
FIG. 3 illustrates an embodiment of a sensor interface circuit according to the invention, wherein the digital filter is implemented as a PI-filter.

FIG. 3 shows an example implementation of the embodiments of FIG. 2. The comparator (130) is implemented as a phase detector. In the digital PI-controller (140) the phase detector output signal is applied to two different paths. One path comprises the digital filter (142) implemented as an integrator. As already mentioned, the digital filter is in preferred embodiments realized as an integrator. The digital filter yields the digital output signal, which is the filtered comparator output signal. The same signal is also fed to the integral feedback element (150), which in turn provides a feedback signal that is in the shown embodiment combined with (added to) the first and second electrical signal at input nodes of the interface circuit. In the other path the phase detector output signal is multiplied with a proportionality factor in the optional block (144) and next applied to the proportional feedback element (180). Note however that in many embodiments the proportionality factor is 1, in which case there is no physical block for performing this multiplication. In other embodiments a multiplication with a proportionality factor can be made in feedback element 1 itself. The resulting feedback signal is combined with the analog filter output signal to obtain the input to the oscillator means.

In continuous time sigma-delta ADCs often a finite impulse response filter (FIR) is added in the feedback to combine the advantages of single-bit feedback (e.g. good linearity) and multi-bit feedback (e.g. more robust against jitter). This is also relevant for closed-loop oscillator based sensor interfaces as in the present invention. The integral feedback element (150) is in typical embodiments already a multi-bit feedback. Still such a FIR filter can be useful to reduce the jitter of the feedback duration, especially when the feedback is determined by the period of the oscillator means, which is inherently variable.

Figure 4:
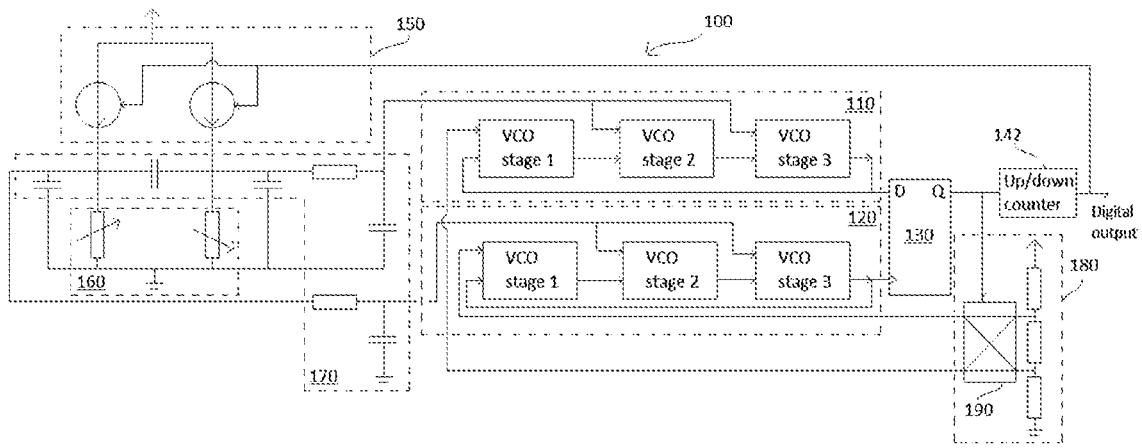
FIG. 4 illustrates a possible practical implementation of an embodiment as depicted in FIG. 2.

FIG. 4 shows in more detail an implementation of a sensor interface circuit according to an embodiment of the invention. The circuit comprises two oscillators (110, 120), in this example voltage controlled oscillators (VCOs). The sensor (160) consists in this embodiment of two resistors of which the resistance value for one increases and for the other decreases if the physical quantity increases. The resistors are biased by current sources, which function as a feedback element (150). The current sources contain a fixed part and a variable part controlled by the output signal of the digital filter. The change in resistance due to the presence of the physical quantity is converted through the current biasing in a voltage difference at the input nodes of the VCOs. If the physical quantity increases, the voltage signal at first instance increases while the voltage at the other node decreases. Generally, the period of a VCO is approximately inversely proportional to the input voltage. Therefore the increase of the physical quantity makes VCO (110) faster and VCO (120) slower, which leads after one or more VCO periods to the situation that one oscillator output signal has its rising edge before the other signal oscillator output signal. At that moment the output of the D flip-flop (130) which is used as phase detector becomes high (assuming the output was low before). This increases the output of the digital filter (142), which is updated every VCO period. This signal is fed back to the current sources used as feedback element (150). This feedback is done in such a way that the phases of oscillator output signals are locked to each other. This means the average frequency of both oscillators is the same. If the two VCOs are perfectly matched, it also means that the average voltage of the signals applied to the oscillating means is regulated to the same value. So the current at the left side is increased while the current at the right side is decreased to compensate for the resistance change caused by the increased physical quantity. The feedback loop ensures the ratio of the current difference and the common mode current is on average equal to the ratio of the resistance difference and the common mode resistance.

The analog filter (170) in the embodiment of FIG. 4 is realised with a network of resistors and capacitors. The skilled person will readily understand that the invention is not limited to the filtering structure shown in FIG. 4, but that any suitable low-pass filtering configuration may be used instead. Preferably, however, only passive components are used because these cannot cause non-linear behaviour in the presence of big deviations due to EMI. As already mentioned, at least the first electrical signal is filtered. Optionally, also the second electrical signal undergoes analog filtering, possibly the same as the first electrical signal.

The oscillators (110, 120) are in this embodiment implemented as a multi-stage ring oscillator. Ring oscillators as such are well known in the art. Their use offers various advantages, like e.g. a wide and easily controllable tuning range, low power consumption, etc. The oscillators receive a feedback signal directly from the proportional feedback element (180). In the ring oscillator of FIG. 4 the feedback signal is applied to the control input of VCO stage 1 of each oscillator, while the filtered sensor signal is applied to the control input of the other stages.

As already mentioned before, there is, apart from the path via the digital filter and the feedback element 150, also a proportional path comprising the other feedback element. In the embodiment of FIG. 4 the proportional feedback element (180) is implemented as a voltage divider. One of the outputs of the voltage divider is going to one oscillator and the other output is going to the other oscillator. So, the proportional feedback signal goes to the first stage of the ring oscillators. The filtered sensor signal is applied to the other stages of the ring oscillators. It depends on the comparator 130 output which output is connected to which oscillator. This is achieved with a switching block 190 which may comprise e.g. four switches controlled by the comparator output signal.

Figure 5:
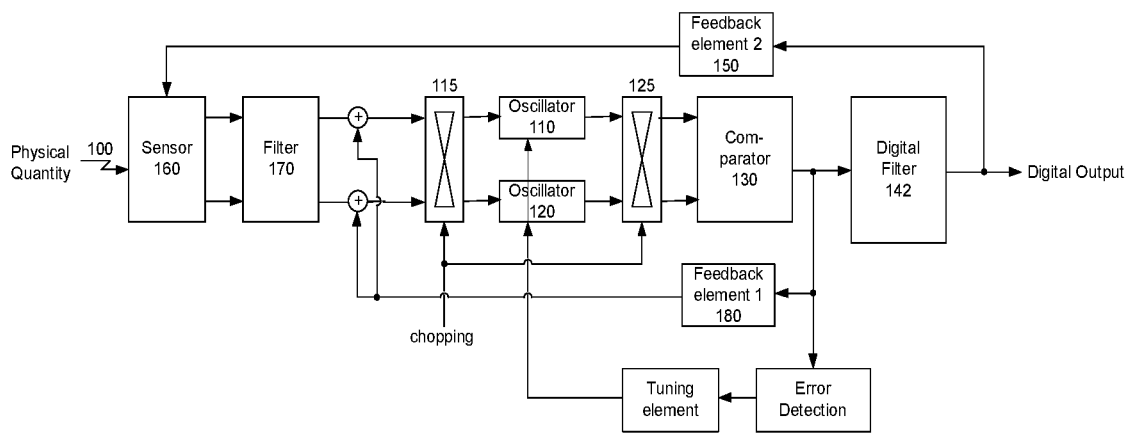
FIG. 5 illustrates an embodiment of the sensor interface circuit wherein chopping and tuning is applied.

In FIG. 5 an embodiment is depicted wherein chopping is applied in the sensor interface circuit. Chopping is a well-known technique to reduce offset and low frequency noise. Note that in FIG. 5 the sensor (160) is shown to be part of the interface circuit. Two chopping blocks (115,125) have been added before and after the oscillators (110, 120), for modulation of the signals to be applied to the oscillators (i.e. chopping with a signal with a frequency $f_{chop}$) and demodulation, respectively. The chopping operation can be divided into two phases. Chopping can facilitate the detection of an offset mismatch between the two oscillators, because such mismatch leads to a difference in the (averaged) digital output in each chopping phase. During one of the two chopping phases the signals output by the analog filter (170) (assuming that in this case both the first and second electrical signal are filtered) are fed via switches to a respective one of the oscillators. Simultaneously the signals output by the oscillators are each connected to an input of the comparator (130). In the other chopping phase the respective oscillators receive at their input the signal they did not receive in the first chopping phase, in other words the inputs are switched compared to the first phase. The same holds for the outputs. The phase of the chopping blocks is controlled by a chopping control signal. Once the signals coming from the oscillators have been dechopped (demodulated), they are compared in the comparator (130) and a digital comparator output signal is output accordingly. The average digital output during one chopping phase or during the other chopping phase is different when there is an offset mismatch between the oscillators. Hence, the difference of the average digital output of one chopping phase from the average digital output of the other chopping phase is a measure for the mismatch. This difference can be detected in the error detection block and used to tune the oscillators by the tuning element in such a way that this difference is compensated. In the tuning element at least one parameter of the sensor interface circuit is tuned, e.g. the gain of the oscillators, so as to reduce the offset error. The tuning causes directly or indirectly in at least one of the oscillators a change in oscillator frequency.

It is not mandatory that the inputs of the modulating chopping block all come from the sensor. Some of the inputs can also come from a reference signal.

The other functional blocks in the scheme of FIG. 5 operate in a similar way as discussed previously with respect to other embodiments. That means that the comparator output signal is applied to feedback element 1 (180) to produce a feedback signal which is combined with the signal output by the analog filter (170), so forming the first and second oscillator input signal, respectively, and that the output signal of the digital filter (142) goes to feedback element 2 (150) to yield a feedback signal which in this exemplary embodiment is fed to the sensor (160).

In a second aspect the invention relates to an oscillator-based sensor interface circuit comprising only one oscillator (110) that receives the filtered signal from the analog filter, whereby the filtered signal impacts the oscillator's frequency. In some embodiments oscillation means comprising only one controlled oscillator is used, for example in case there is only one sensor (e.g. a capacitor) influenced by the physical quantity. Various kinds of controlled oscillator can be envisaged for use in the sensor interface circuit. An obvious choice is a voltage controlled oscillator or a current controlled oscillator, but other options are valid too, e.g. a capacitance controlled oscillator.

In embodiments according to this second aspect the sensor interface circuit comprises at least one input node which receives an electrical signal representative of an electrical quantity. The electrical quantity is a converted version of the physical quantity sensed by the sensing means (which is part of the interface circuit or not, as explained). As in embodiments according to the first aspect, an additional, but fixed (i.e. uncontrolled) oscillator can be used for example to generate the master clock for the digital core of the chip comprising the sensor interface circuit. This master clock can also be used to sample some internal signals, e.g. the differentiator and integrators in FIG. 6. Furthermore the fixed clock is used to generate the control signals, e.g. the selection signal of the multiplexer.

Figure 6:
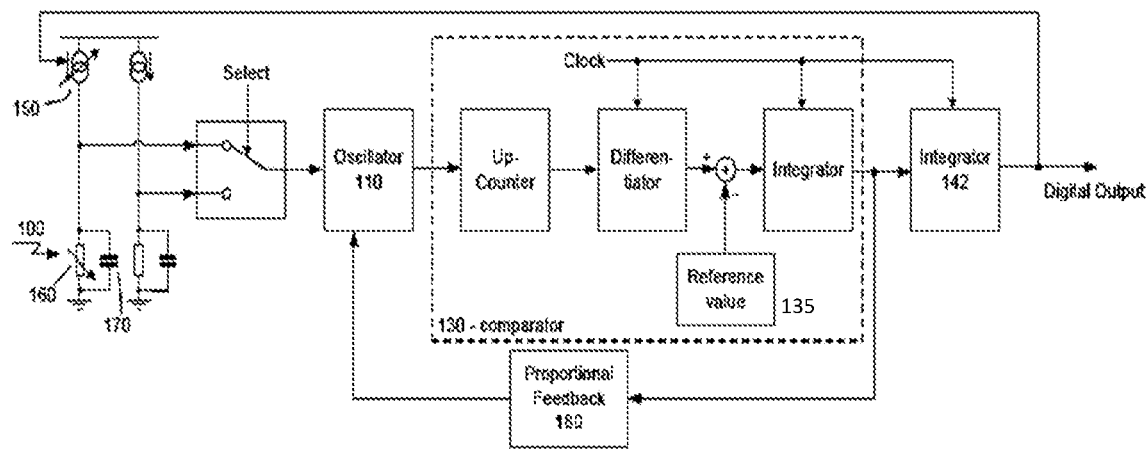
FIG. 6 illustrates an embodiment of the sensor interface circuit with a single oscillator.

An embodiment of an oscillator-based sensor interface circuit according to this second aspect is illustrated in FIG. 6. The single oscillator (110) is preceded by a switching/ multiplexing means so that the input to the oscillator can be selected to come from one of two or more sources. The switching/multiplexing is controlled by means of a digital controller (not shown in FIG. 6), whereby there is a phase wherein a first signal is applied to the oscillator and a phase wherein a second signal is applied, resulting in a different oscillator frequency. These two frequencies are compared in the comparator. If the sensor generates a differential signal, the multiplexer can switch between both signals forming the differential signal. If the sensor generates a single-ended signal, as in the case shown in FIG. 6, the multiplexer can switch between the sensor signal and a reference signal. In this example a reference voltage signal is created by a fixed current flowing through a fixed resistor. The sensor comprises a variable resistor. The current source on top of the sensor resistor acts as feedback element 2 (150) in this embodiment and is adjusted to get the resulting sensor voltage equal to the reference voltage.

The multiplexer can also switch between different sensor signals (or other signals to be monitored) if multiple sensors or other channels have to be converted to the digital domain. Note that in embodiments like that of FIG. 6 a further oscillator is still part of the chip, namely for generating the master clock that determines e.g. the sampling instants, as already mentioned above. A practical example of a use case for a sensor interface circuit embodied as in FIG. 6, is where a sensor with only one output is applied, e.g. a Negative Temperature Coefficient (NTC) sensor.

The benefit of embodiments as in FIG. 6 is that mismatch between the oscillators, e.g. voltage controlled oscillators, or coupling between the oscillator outputs is avoided. In any application scheme there is always some mismatch, even between functional blocks with exactly the same schematic and layout. This especially holds for voltage controlled oscillators (or other controlled oscillators, like current controlled oscillators or sensor controlled oscillators). The mismatch also varies over time and over temperature. As they continuously toggle, two VCOs oscillating at similar frequencies can interfere with each other, leading to artefacts in the digital output. Embodiments like in FIG. 6 may further also have a better energy efficiency, as the oscillators are the main contributors to the power consumption. Such embodiments of the sensor interface circuit may be useful in applications where compactness and energy efficiency are crucial.

It is to be noted that the other functional blocks shown in FIG. 6 are basically the same as in the embodiments according to the first aspect and depicted e.g. in FIG. 2 or FIG. 3. A more detailed implementation of the comparator block (130) is shown in FIG. 6. The comparator of FIG. 6 comprises an upcounter that counts the periods in the oscillator output signal, a differentiator that determines the difference of the newly counted value with the previous counter value in order to get the amount of oscillator periods between two sampling moments. Afterwards another difference is made versus a reference value (that was stored e.g. in a register). The resulting difference is further integrated in an integrator block to which the difference is input. The integrator accumulates these received differences until a new phase is started, i.e. when a switch is made to the other input. The output of the comparator block is then applied to the digital filter (142) as already described above.

Figure 7:
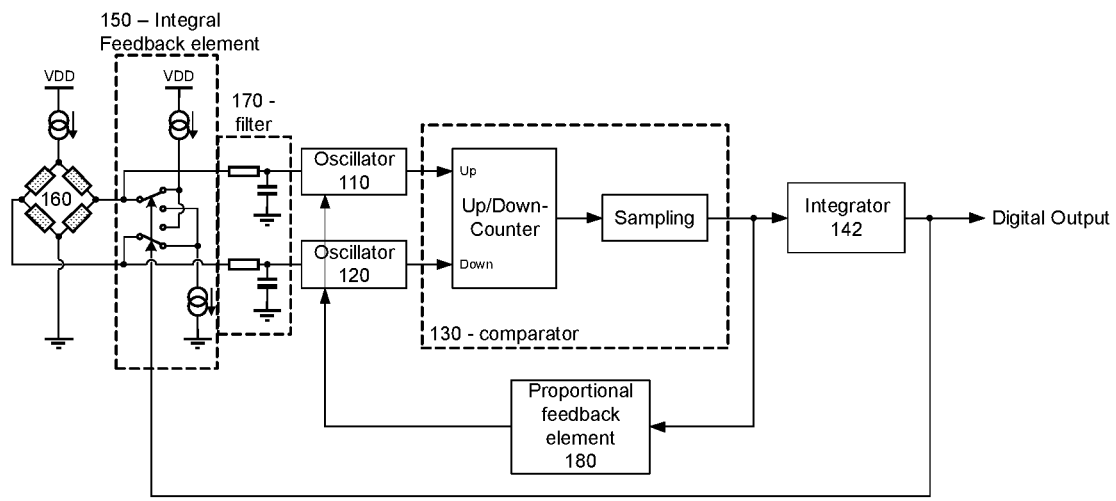
FIG. 7 illustrates yet another embodiment of the sensor interface circuit.

A further exemplary embodiment is shown in FIG. 7. In this scheme a number of building blocks are combined that were already shown in one or more of the embodiments of the preceding figures. Again a scheme with two oscillators (110, 120) is considered. The resistance sensing means are implemented in a Wheatstone bridge configuration. The integral feedback element (150) connects a pull-up current to one output node of the Wheatstone bridge and a pull-down current to the other output node of the sensor bridge. The switches are controlled by the digital filter output signal that is fed back. Current is supplied via the switches by means of current sources. The analog filter (170) is in this embodiment represented as a RC network and both the first and the second electrical signal are filtered in the same way. The comparator (130) is shown to comprise an up/down counter to count the periods in the signals output by oscillator (110) and oscillator (120), respectively. A resulting signal indicative of the difference in the number of periods of both oscillators is sampled and applied to the proportional feedback element (180) and to an integrator (142), where the number of periods in that resulting signal is summed. That information is then used to control the switches in the integral feedback element (150).

Figure 8:
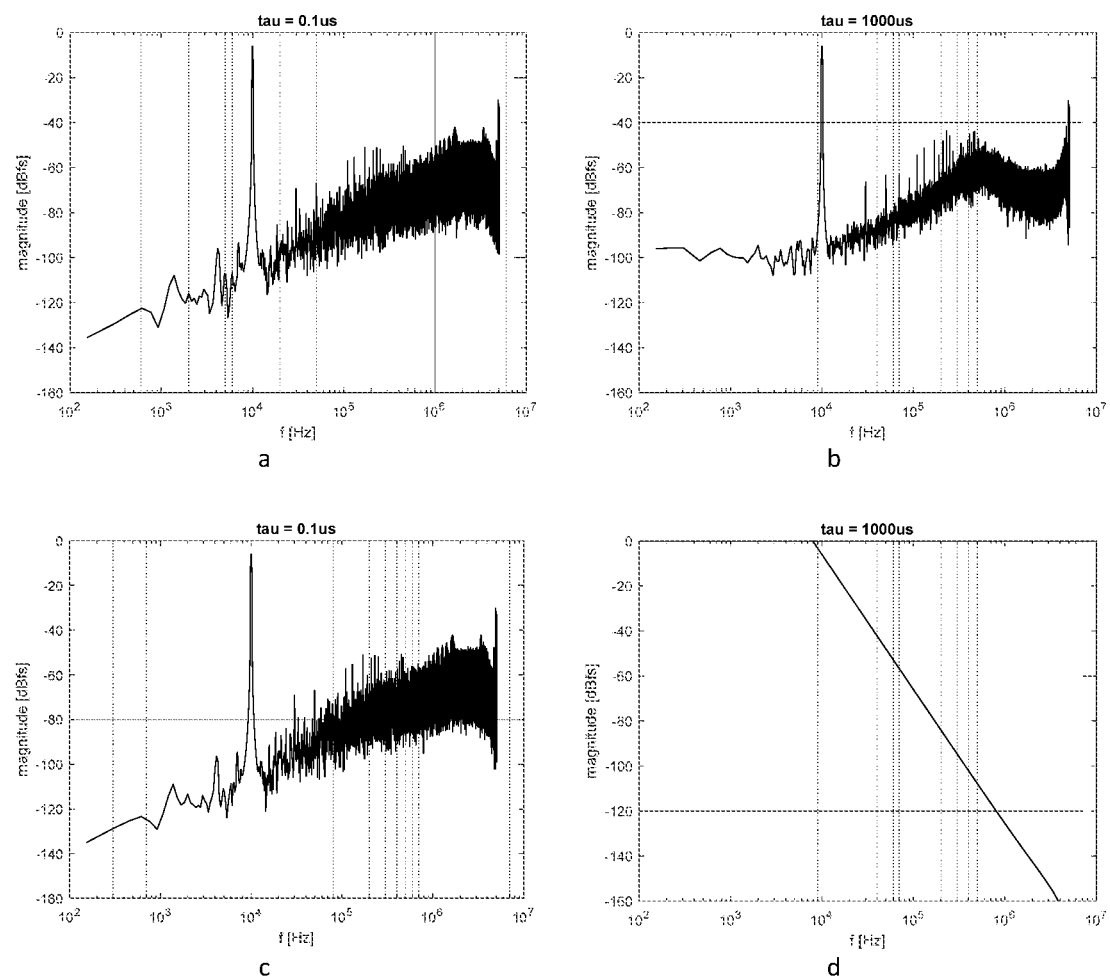
FIG. 8 illustrates some simulation results to demonstrate the improved stability.

To illustrate how the proposed approach indeed leads to an improvement of the stability, some simulation results are depicted in FIG. 8. More in particular, simulation results of the frequency spectrum when the interface circuit measures a sensor signal of 10kHz. FIG. 8a and FIG. 8b are the results obtained with a circuit like in FIG. 2b, whereas FIG. 8c and FIG. 8d depict the results when the proportional and integral feedback are both performed on to the sensor signal. FIG. 8a and FIG. 8c use a negligible lowpass filter (having a time constant $\tau$=0.1 µs, which is 1000 times smaller than the average period of the oscillators). FIG. 8b and FIG. 8d use a filter with a time constant of 1 ms (so, 10 times bigger than the average oscillator period). There is almost no difference between FIG. 8a and FIG. 8c, which is normal, because the filter is negligible. FIG. 8d illustrates the system does not function properly if the proportional and integral feedback are both done to the sensor signal when there is a lot of filtering. FIG. 8c however shows still a good noise shaping, illustrating that the circuit designed according to the invention remains operational when a lowpass filter is added (but with a higher noise floor).

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. An oscillator-based sensor interface circuit comprising:
   at least a first and a second input node arranged to receive a first and a second electrical signal representative of an electrical quantity, respectively, at least said electrical quantity of said first electrical signal being a converted physical quantity,
   an analog filter arranged to filter at least said first electrical signal,
   oscillation means comprising at least a first oscillator arranged to receive a first oscillator input signal and a second oscillator different from said first oscillator and arranged to receive a second oscillator input signal, said first oscillator input signal being said filtered first electrical signal from said analog filter and said second oscillator input signal being said second electrical signal or a filtered version thereof, said first and second oscillator input signal impacting said oscillators' frequency,
   comparator means arranged to compare signals coming from said first and second oscillators of said oscillation means and for outputting a digital comparator output signal in accordance with the outcome of said comparing,
   a first feedback element arranged to receive a representation of said digital comparator output signal and to convert said representation into a first feedback signal to be applied to said oscillation means, either directly or combined with said first and/or second oscillator input signal, respectively,
   a digital filter arranged to yield an output signal of the oscillator-based sensor interface circuit, said output signal being a filtered version of said digital comparator output signal,
   a second feedback element arranged to receive said output signal and to convert said output signal into a second feedback signal, said second feedback signal to be combined with said first and/or second electrical signal at said at least first and/or second input nodes, respectively.

2. The oscillator-based sensor interface circuit as in claim 1, wherein said interface circuit further comprises chopping circuitry arranged for modulating said first and said second oscillator input signal with a chopping signal and for feeding the modulated signal to said oscillation means and arranged for demodulating said signals coming from said first and second oscillators of said oscillation means.

3. The oscillator-based sensor interface circuit as in claim 1, comprising a further oscillator arranged to generate a master clock signal for performing sampling.

4. The oscillator-based sensor interface circuit as in claim 1, wherein said oscillation means comprises a ring oscillator, wherein at least one stage of said ring oscillator is controlled by said first feedback signal and at least one stage of said ring oscillator is controlled by said filtered first electrical signal received from said analog filter.

5. The oscillator-based sensor interface circuit as in claim 1, wherein said comparator means comprises storage means for storing said digital comparator output signal.

6. The oscillator-based sensor interface circuit as in claim 1, wherein said comparator means is arranged to add dither before comparing said signals from said oscillation means.

7. The oscillator-based sensor interface circuit as in claim 1, wherein said digital filter comprises an integrator arranged to yield said integrated version of said digital comparator output signal.

8. The oscillator-based sensor interface circuit as in claim 1, wherein said digital filter comprises a finite impulse response filter.

9. The oscillator-based sensor interface circuit as in claim 1, wherein said comparator means is implemented as a flip-flop.

10. The oscillator-based sensor interface circuit as in claim 1, comprising a sensing means arranged to convert a physical quantity into said electrical quantity and to output said first electrical signal representative of said electrical quantity.

11. The oscillator-based sensor interface circuit as in claim 10, wherein said sensing means is arranged to receive said second feedback signal.

12. The oscillator-based sensor interface circuit as in claim 1, wherein said received signal is a pressure, a temperature, a force, an optical signal or a magnetic signal.

13. The oscillator-based sensor interface circuit comprising:
   at least one input node arranged to receive an electrical signal representative of an electrical quantity, said electrical quantity being a converted physical quantity,
   an analog filter arranged to filter said electrical signal,
   oscillation means comprising one oscillator and arranged to receive said filtered signal from said analog filter, said filtered signal impacting said oscillator's frequency,
   comparator means arranged to compare a signal coming from said oscillation means with a reference value and for outputting a digital comparator output signal in accordance with the outcome of said comparing,
   a first feedback element arranged to receive a representation of said digital comparator output signal and to convert said representation into a first feedback signal to be applied to said oscillation means, either directly or combined with said filtered signal from said analog filter,
   a digital filter arranged to yield an output signal of the oscillator-based sensor interface circuit, said output signal being an filtered version of said digital comparator output signal,
   a second feedback element arranged to receive said output signal and to convert said output signal into a second feedback signal, said second feedback signal to be combined with the electrical signal at said at least one input node,
   a switching device arranged to switch between at least two signals to be applied alternately to said oscillation means.

14. The oscillator-based sensor interface circuit as in claim 13, wherein the switching device is provided between said analog filter and said oscillation means.

15. The oscillator-based sensor interface circuit as in claim 14, arranged for deriving said reference value from said signal coming from said oscillation means while a reference signal is applied via said switching device.

16. The oscillator-based sensor interface circuit as in claim 13, comprising a further oscillator arranged to generate a master clock signal for performing sampling.

17. The oscillator-based sensor interface circuit as in claim 13, wherein said oscillation means comprises a ring oscillator, wherein at least one stage of said ring oscillator is controlled by said first feedback signal and at least one stage of said ring oscillator is controlled by said filtered first electrical signal received from said analog filter.

18. The oscillator-based sensor interface circuit as in claim 13, wherein said digital filter comprises an integrator arranged to yield said integrated version of said digital comparator output signal.

19. The oscillator-based sensor interface circuit as in claim 13, comprising a sensing means arranged to convert a physical quantity into said electrical quantity and to output said first electrical signal representative of said electrical quantity.

20. The oscillator-based sensor interface circuit as in claim 13, wherein said sensing means is arranged to receive said second feedback signal.

* * * * *